(12) United States Patent
Yukimoto et al.

(10) Patent No.: US 7,504,772 B2
(45) Date of Patent: Mar. 17, 2009

(54) LIGHT-EMITTING DIODE ARRAY

(75) Inventors: Tomihisa Yukimoto, Tokyo (JP); Eiichi Kunitake, Tokyo (JP); Satoshi Sugiyama, Tokyo (JP); Yosuke Komori, Tokyo (JP); Toshimitsu Sukegawa, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 280 days.

(21) Appl. No.: 10/793,248

(22) Filed: Mar. 5, 2004

(65) Prior Publication Data
US 2004/0174118 A1 Sep. 9, 2004

(30) Foreign Application Priority Data
Mar. 7, 2003 (JP) .............................. 2003-062154

(51) Int. Cl.
H05B 33/04 (2006.01)
H05B 33/10 (2006.01)
H01L 29/18 (2006.01)
H01L 33/00 (2006.01)

(52) U.S. Cl. ........................... 313/506; 257/88; 257/93

(58) Field of Classification Search .......... 313/504–506; 257/88, 93
See application file for complete search history.

(56) References Cited

U.S. PATENT DOCUMENTS

| | | | | |
|---|---|---|---|---|
| 4,680,602 A | * | 7/1987 | Watanabe et al. | ............. 257/13 |
| 5,328,808 A | * | 7/1994 | Sakamoto | .................... 430/313 |
| 2001/0007359 A1 | * | 7/2001 | Ogihara et al. | ................ 257/88 |
| 2003/0010989 A1 | * | 1/2003 | Yukimoto | ..................... 257/88 |

FOREIGN PATENT DOCUMENTS

| | | |
|---|---|---|
| JP | 10-157193 | 6/1998 |
| JP | 2000-323750 | 11/2000 |
| JP | 2001-257380 | 9/2001 |
| JP | 2003-031840 | 1/2003 |

* cited by examiner

Primary Examiner—Nimeshkumar D. Patel
Assistant Examiner—Anne M Hines
(74) Attorney, Agent, or Firm—Sughrue Mion, PLLC

(57) ABSTRACT

A light-emitting diode array comprising a conductive layer formed on a substrate, separate light-emitting portions formed on the conductive layer, a first electrode formed on at least part of an upper surface of each light-emitting portion, and a second electrode formed on the conductive layer adjacent to the light-emitting portions; the first electrode comprising a common switching electrode matrix; the second electrode comprising a common electrode divided such that one second electrode exists in every block; and at least one of bonding pads extending to the first common electrode and the second common electrode being formed on a bonding portion formed on the conductive layer like an island, whereby the bonding pads are separate from each other.

4 Claims, 5 Drawing Sheets

LIGHT-EMITTING DIODE ARRAY

FIELD OF THE INVENTION

The present invention relates to a light-emitting diode array of high emission power, and particularly to a light-emitting diode array suitable for light sources of electrophotographic printers.

BACKGROUND OF THE INVENTION

An electrophotographic printer forms an electrostatic latent image on a photosensitive drum by light according to an image signal, develops the latent image by selectively attracting toner thereto, and then transfers the developed image onto a paper to obtain a print image. As a light source for forming the electrostatic latent image, a laser and a light-emitting diode array are widely used. In particular, since a light source constituted by the light-emitting diode array does not need a long optical path unlike the laser-type light source, it is suitable for small-sized printers and large-sized printing. Demand has been mounting recently on light-emitting diode arrays of higher precision, higher emission power and low in cost, as printing has been becoming faster with higher image quality, and as printers have been becoming smaller.

Usable to produce low-cost light-emitting diode arrays are not the provision of ICs for separately driving light-emitting diodes (static driving system), but the arrangement of light-emitting diodes in the number of the n-th power of 2 in one block, which are subjected to time division operation by a switching matrix wiring, thereby reducing the number of driving ICs and bonding wires (dynamic driving system).

In the production of such light-emitting diode arrays, Ti/Au and Mo/Au are widely used as wiring materials. The formation of these wirings may be conducted by a lift-off method, which comprises photoresist patterning, electron beam-heating vapor deposition and the removal of unnecessary portions together with the photoresist, and a sputtering/ion-milling method, which comprises depositing Ti/Au, Mo/Au, etc. onto the entire wafer by sputtering, and physically removing a patterned photoresist and an insulating mask of $SiO_2$, etc. Because the lift-off method has insufficient step coverage, wiring layers in LEDs having large mesa-etched steps are easily broken at the steps. Though wiring layers formed by the sputtering/ion-milling method have good step coverage and are resistant to breakage at the steps, Au disadvantageously tends to remain at the mesa-etched steps. Particularly, LEDs of the dynamic driving system comprising common electrodes are disadvantageous in the short-circuiting of wirings by Au remaining after working, resulting in undesired light emission.

FIG. 4 is a plan view showing a conventional light-emitting diode array of a two-divided dynamic driving system. FIG. 5(a) is a plan view showing one of blocks shown in FIG. 4. FIG. 5(b) is a cross-sectional view taken along the line A-A in FIG. 5(a), and FIG. 5(c) is a cross-sectional view taken along the line B-B in FIG. 5(a). A plurality of light-emitting portions 1 is arranged at predetermined intervals on a p-type GaAs conductive layer 11 formed on an n-type GaAs substrate 10. Each light-emitting portion 1 comprises a p-type AlGaAs etching stopper layer 12, a p-type AlGaAs clad layer 13, a p-type AlGaAs active layer 14, an n-type AlGaAs clad layer 15, and an n-type GaAs cap layer 16, which are laminated on the p-type GaAs conductive layer 11 in this order. The light-emitting area of the light-emitting portion 1 has a double-hetero structure composed of the p-type AlGaAs clad layer 13, the p-type AlGaAs active layer 14, and the n-type AlGaAs clad layer 15.

Each light-emitting portion 1 is formed by removing part of epitaxial layers by mesa etching. The mesa-etched groove comprises a first mesa-etched groove 19 separating the light-emitting portions 1 from bonding portions 8a, 8c, and second mesa-etched grooves 20 dividing blocks from each other.

Each light-emitting portion 1 has a cathode 2 formed on part of the upper surface thereof. An anode 3 provided on each p-type GaAs conductive layer 11 adjacent to the light-emitting portion 1 is formed by vapor-depositing metals on the p-type GaAs conductive layer 11 and turning the metals to an alloy. Except for contact holes 7c, 7a for the cathode 2 and the anode 3, the light-emitting portions 1 and an exposed surface of the conductive layer 11 are covered by a first insulating film 17 made of PSG (phosphorus glass). Common electrodes 4, 4 are formed on the first insulating film 17 covering the bonding portion (mesa-top surface) 8c. After covering the common electrodes 4, 4 with a second insulating film 18, an Au wiring layer 5c is formed, such that it extends from one end connected to the cathode 2 not covered by the second insulating film 18, to the other end formed on a bonding portion 8c, which is connected to one of the common electrodes 4, 4 and constitutes a bonding pad 6c. An Au wiring layer 5a is formed, such that it extends from one end connected to the anode 3 to the other end on the surface of the bonding portion (mesa-top surface) 8a, which constitutes a bonding pad 6a.

When the Au wiring layers 5 are formed on the light-emitting diode array of such a structure by a sputtering/ion-milling method, Au tends to remain on the slanting surfaces 21 of the first mesa-etched groove 19 after ion-milling, unsatisfactory to prevent the short-circuiting of Au wirings (see JP 2000-323750 A). Though this problem can be solved by removing all epitaxial layers by the first mesa-etched groove 19 except for the light-emitting portions 1, and forming wiring layers, common electrodes and bonding pads on the bottom surface of the mesa-etched groove, another problem occurs. That is, when all epitaxial layers are etched except for the light-emitting portions 1, there is difference in depth between large etching areas and small etching areas between the light-emitting portions. Because an etching speed depends on an area to be etched (loading effect), it is extremely difficult to control the dimension the light-emitting portions affecting the performance of the light-emitting diode array.

JP 10-157193 A discloses a light-emitting diode array having recesses in part of a semiconductor substrate, in which common electrodes are formed. However, because only common electrodes are formed in the recesses in this system, Au remaining on the slanting surfaces of the mesa-etched grooves tends to cause short-circuiting.

OBJECTS OF THE INVENTION

Accordingly, an object of the present invention is to provide a light-emitting diode array with a high yield and excellent mass producibility and free from the short-circuiting of wirings due to Au remaining after working on slanting surfaces of mesa-etched steps, which comprises light-emitting portions with easy dimension control.

Another object of the present invention is to provide a method for producing such a light-emitting diode array.

DISCLOSURE OF THE INVENTION

As a result of intense research in view of the above-mentioned objects, the inventors have found that by forming bonding pads on bonding portions (mesa-top surfaces) separated by mesa-etched grooves, the short-circuiting of wirings due to Au remaining after working can be prevented. The present invention has been completed based on this finding.

Thus, the light-emitting diode array of the present invention comprises a conductive layer formed on a substrate, separate light-emitting portions formed on the conductive layer, a first electrode formed on at least part of an upper surface of each light-emitting portion, and a second electrode formed on the conductive layer adjacent to the light-emitting portions; the first electrode comprising a common switching electrode matrix; the second electrode comprising a common electrode divided such that one second electrode exists in every block; and at least one of bonding pads extending to the first common electrode and the second common electrode being formed on a bonding portion formed on the conductive layer like an island, whereby the bonding pads are separate from each other.

One of a bonding pad on the side of the first electrode and a bonding pad on the side of the second electrode may be formed on an insulating layer formed in a mesa-etched groove. The common electrode matrix is preferably formed on an insulating layer formed in a mesa-etched groove.

In the light-emitting diode array of the present invention, the light-emitting portions and the bonding portions are preferably formed by separating or dividing epitaxial layers formed on the conductive layer by mesa-etched grooves. In the light-emitting diode array according to a preferred embodiment, the bonding pads are formed on separate bonding portions, so that there is no short-circuiting between the bonding pads even though Au wiring remains on slanting surfaces of the mesa-etched grooves. Also, because the bonding portions are formed on the epitaxial layers remaining after the formation of the first mesa-etched groove, an etched area need not be increased. It is thus possible to avoid a loading effect, and easy to control the dimension of the light-emitting portions, epitaxial layers left after the formation of the first mesa-etched groove.

DESCRIPTION OF THE PREFERRED EMBODIMENTS

[1] Structure of Light-emitting Diode Array

Figure 1:
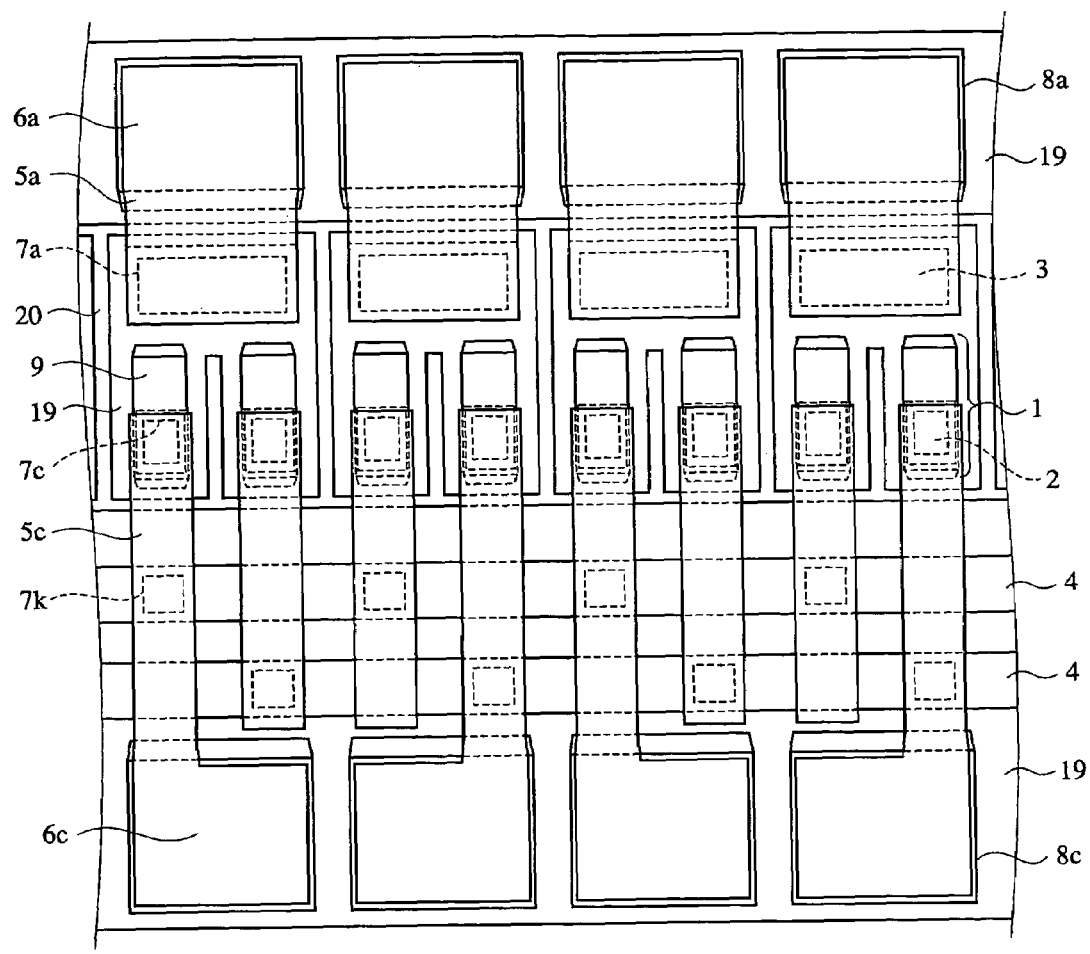
FIG. 1 is a plan view showing the light-emitting diode array according to one embodiment of the present invention.
Figure 2A:
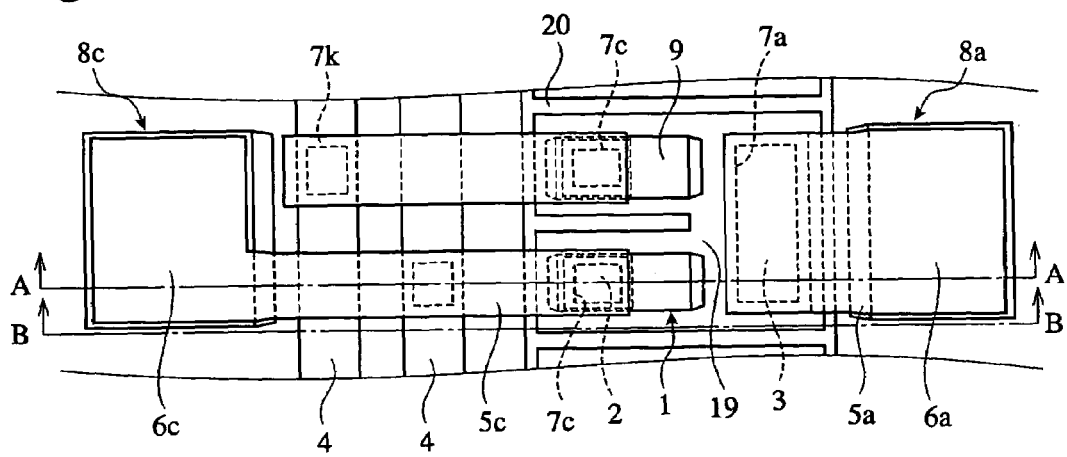
FIG. 2(a) is a plan view showing a unit cell constituting the light-emitting diode array shown in FIG. 1.
Figure 2B:
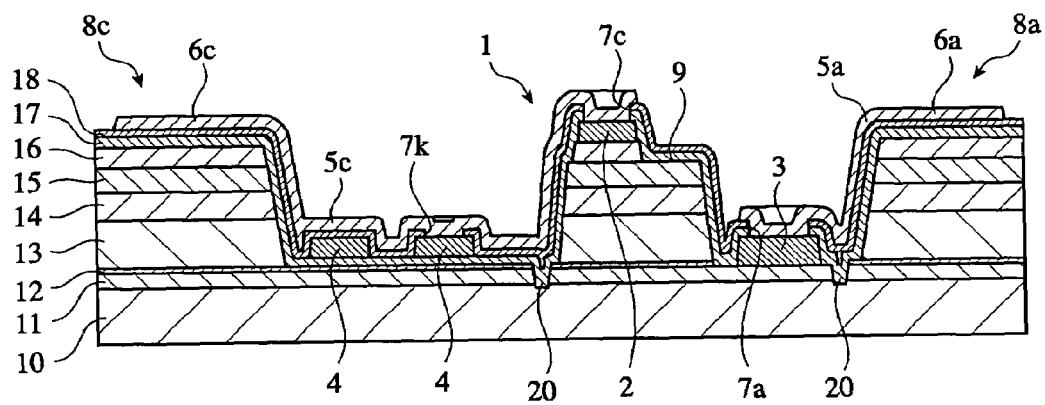
FIG. 2(b) is a cross-sectional view taken along the line A-A in FIG. 2(a)
Figure 2C:
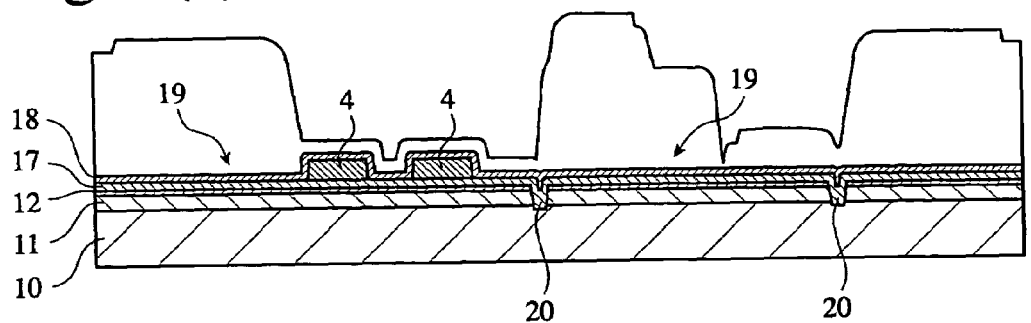
FIG. 2(c) is a cross-sectional view taken along the line B-B in FIG. 2(a)

As shown in FIGS. 1 and 2, the light-emitting diode array of the present invention comprises a substrate 10, a plurality of light-emitting portions 1 formed on the substrate 10, a first electrode 2 partially formed on a top surface of each light-emitting portion 1, and a second electrode 3 formed on the conductive layer 11 adjacent to the light-emitting portions 1. In the depicted embodiment, each light-emitting portion 1 is a separate epitaxial layer portion obtained by dividing an epitaxial layer uniformly formed on the substrate 10 by mesa-etched grooves 19, 20.

(1) Substrate

The substrate 10 is not particularly restrictive as long as it may be used for light-emitting diodes, and it need only have a structure capable of electrically insulating the light-emitting parts. It may be either an n-type substrate or a p-type substrate, and a semi-insulating substrate such as a semi-insulating GaAs substrate, etc. or an insulating substrate may also be used. The substrate 10 and the conductive layer 11 may be insulated from each other by forming a high-resistance layer such as an undoped GaAs layer, etc., or by forming a semiconductor layer having an opposite polarity to that of the conductive layer 11.

(2) Light-emitting Portion

The type and thickness of a compound semiconductor crystal layer laminated on the conductive layer 11 on the substrate 10 may be properly determined depending on the desired light emission wavelength and light-emitting power. Usable as the compound semiconductors are, for instance, AlGaAs, AlGaInP, etc. The light-emitting portion 1 preferably has a double hetero structure comprising a clad layer of a first conductor type, an active layer and a clad layer of a second conductor type, which is preferably formed by dividing an epitaxial layer formed on the conductive layer 11 by a first mesa-etched groove 19. A second mesa-etched groove 20 divides the conductive layer 11 to each block.

The light-emitting diode array according to the depicted embodiment of the present invention comprises separate light-emitting portions 1 each constituted by a p-type AlGaAs etching stopper layer 12, a p-type AlGaAs clad layer 13, a p-type AlGaAs active layer 14, an n-type AlGaAs clad layer 15 and an n-type GaAs cap layer 16 formed in this order on an n-type GaAs substrate 10 via a p-type GaAs conductive layer 11. The n-type GaAs cap layer 16 is removed by etching in regions of light-emitting portions 9. To prevent short-circuiting to an Au wiring layer 5, insulating layers 17, 18 cover the entire surface of each light-emitting portion 1 except for each cathode 2.

The above light-emitting portion 1 has a so-called double hetero structure in a region directly contributing to light emission, which comprises a p-type AlGaAs active layer 14 having an energy band gap corresponding to an emission wavelength sandwiched by a p-type AlGaAs clad layer 13 (clad layer of a first conductor type) and an n-type AlGaAs clad layer 15 (clad layer of a second conductor type) both having larger energy band gaps than that of the active layer 14.

(3) Electrode and Wiring Layer

What is required is only that one of the first and second electrodes is a cathode, while the other is an anode. Accordingly, for instance, the first electrode per se may be either a cathode or an anode. Each electrode is required to have good bonding characteristics as well as good ohmic contact to underlayers. For instance, an AuZnINi/Au laminate electrode may be used as the anode, and an AuGe/Ni/Au laminate electrode may be used as the cathode.

Each of the common electrodes and the Au wiring layer is preferably constituted by a plurality of metal layers, because it is required to have good bonding characteristics as well as good adhesion to an upper layer and an underlayer. Each of the uppermost layer and the undermost layer is preferably a metal layer such as Ti, Mo, etc. having good bonding characteristics as well as good adhesion to insulating layers. For instance, a laminate electrode such as Ti/Au/Ti, Mo/Au/Mo and TiW/Au/TiW may be used as a common electrode.

In each electrode, the metal layers can be formed by a method such as a resistance-heating vapor deposition method, an electron beam-heating vapor deposition method, sputtering method, etc., and the oxide layer can be formed by various known film-forming methods. A heat treatment (alloying) is preferably performed on the metal layers, to make an ohmic electrode.

In the embodiment shown in FIGS. 1 and 2, the cathode 2 is formed on the mesa-top surface of each light-emitting portion 1, and the side surfaces of the light-emitting portion 1 and the cathode 2 are covered by the first insulating layer 17. The cathode 2 exposed in a contact hole 7 on each light-emitting portion 1 is connected to one of two common electrodes 4, 4 via an Au wiring layer 5c, forming a bonding pad 6c on a separate bonding portion 8c. An anode 3 is formed on the p-type GaAs conductive layer 11 at a position adjacent to each light-emitting portion 1 in an ohmic contact manner. The anode 3 is connected to a bonding pad 6a on a mesa-top surface of a bonding portion 8a via an Au wiring layer 5a.

(4) Mesa-etched Groove

The mesa-etched groove for forming separate light-emitting portions 1 and separate bonding portions 8 comprises a first mesa-etched groove 19 reaching the conductive layer 111 or the etching stopper layer 12 for electrically separating the light-emitting portions 1 from the bonding portions 8, and second mesa-etched grooves 20 removing the conductive layer 11 for separating blocks of the light-emitting portion 1 from each other. The first mesa-etched groove 19, a characteristic constituent of this light-emitting diode array, forms not only the separate light-emitting portions 1 but also the separate bonding portions 8.

[2] Production of Light-emitting Diode Array

The light-emitting diode array of the present invention can be produced by the same methods as the conventional ones except for forming separate bonding portions 8 by the first mesa-etched groove 19. In a preferred embodiment, a p-type GaAs conductive layer 11 (carrier concentration: $4 \times 10^{19}$ cm$^{-3}$, thickness: 1 μm), a p-type AlGaAs etching stopper layer 12 (carrier concentration: $3 \times 10^{19}$ cm$^{-3}$, thickness: 0.1 μm), a p-type AlGaAs clad layer 13 (carrier concentration: $1 \times 10^{18}$ cm$^{-3}$, thickness: 1 μm), a p-type AlGaAs active layer 14 (carrier concentration: $1 \times 10^{18}$ cm$^{-3}$, thickness: 1 μm), an n-type AlGaAs clad layer 15 (carrier concentration: $2 \times 10^{18}$ cm$^{-3}$, thickness: 3 μm), and an n-type GaAs cap layer 16 (carrier concentration: $1 \times 10^{18}$ cm$^{-3}$, thickness: 0.5 μm) are grown in this order on a top surface of the n-type GaAs substrate 10 by a metal-organic vapor phase epitaxy (MOVPE) method.

Figure 3A:
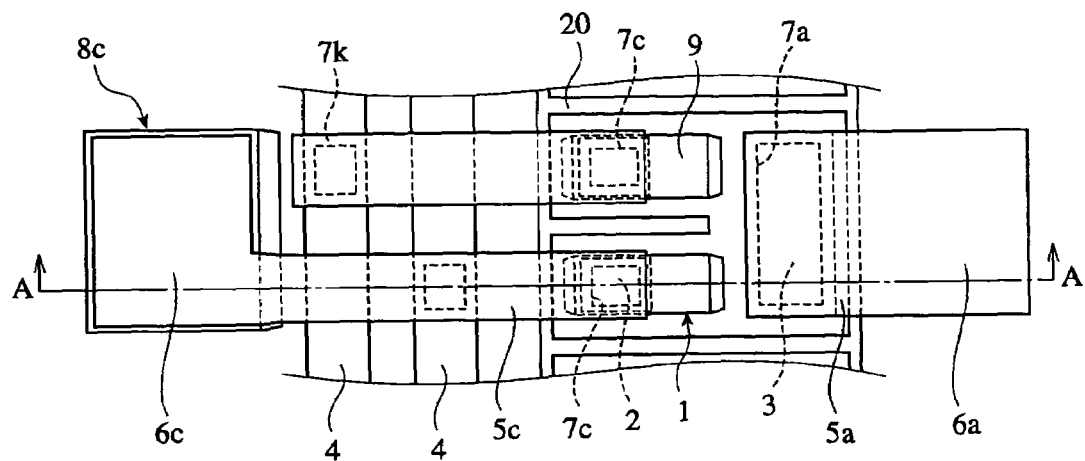
FIG. 3(a) is a plan view showing a unit cell constituting the light-emitting diode array according to another embodiment of the present invention.
Figure 3B:
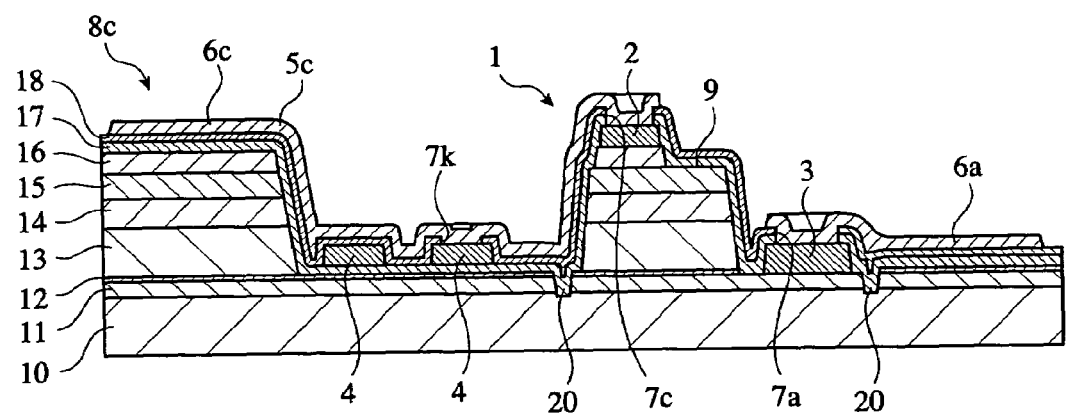
FIG. 3(b) is a cross-sectional view taken along the line A-A in FIG. 3(a)
Figure 4:
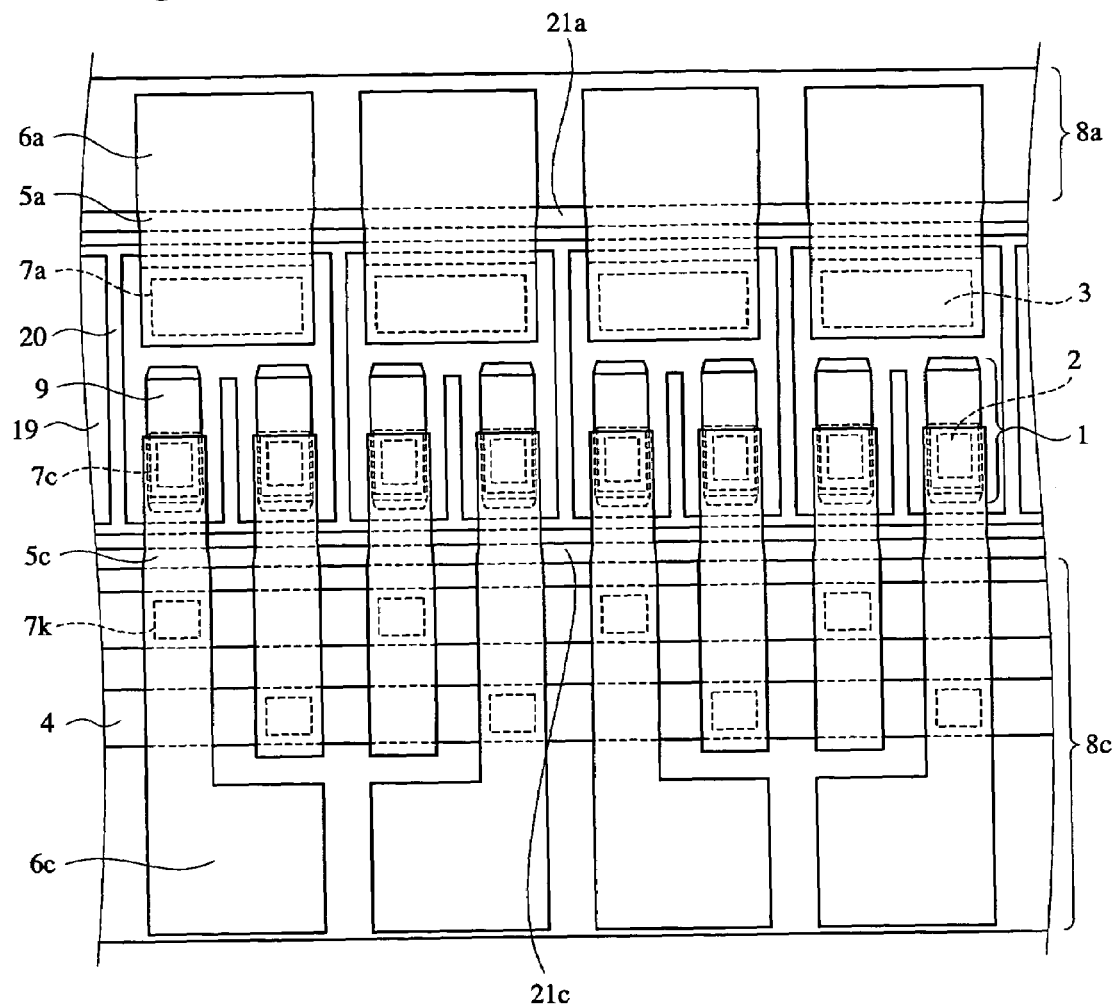
FIG. 4 is a plan view showing a conventional light-emitting diode array.
Figure 5A:
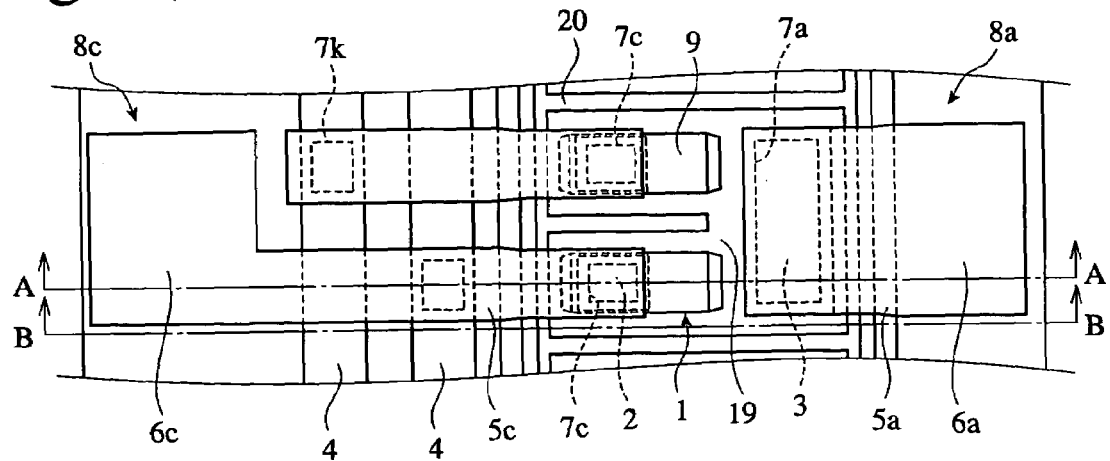
FIG. 5(a) is a plan view showing a unit cell constituting the light-emitting diode array shown in FIG. 4.
Figure 5B:
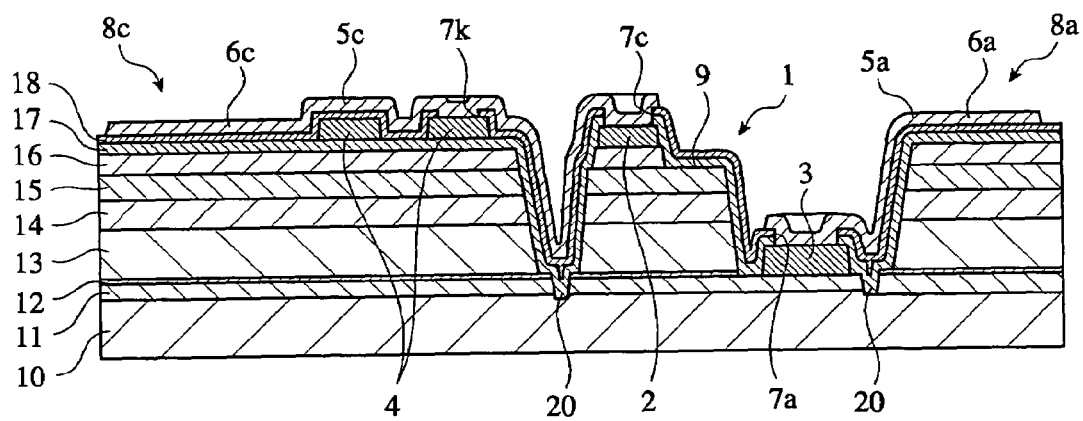
FIG. 5(b) is a cross-sectional view taken along the line A-A in FIG. 5(a)
Figure 5C:
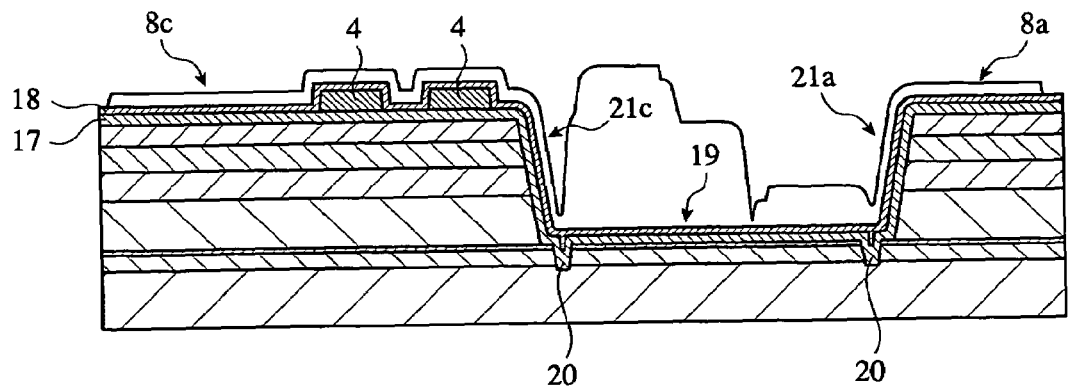
FIG. 5(c) is a cross-sectional view taken along the line B-B in FIG. 5(a).

The resultant crystal layers are subjected to selective wet etching. First, the n-type GaAs cap layer 16 is removed in the light-emitting portions 1 except its portions in contact with the cathodes 2. Next, the first mesa-etched groove 19 is formed to such a depth that the p-type AlGaAs etching stopper layer 12 is exposed, to divide the epitaxial layers on the p-type GaAs conductive layer 11 to plural light-emitting portions 1 separated from the bonding portions 8a, 8c. Either one of bonding portions 8a, 8c may be removed as shown in FIG. 3 as long as the loading effect is avoided. Further, the p-type GaAs conductive layer 11 is removed by the second mesa-etched grooves 20 to electrically separate each block of the light-emitting portions 1. In this case, the second mesa-etched grooves 20 preferably have such depth that the n-type GaAs substrate 10 is slightly etched, so that no conductive layer 11 remains in areas corresponding to the second mesa-etched grooves 20 even though there are etching errors.

The cathode 2 (AuGe/Ni/Au) and the anode 3 (AuZn/Ni/Au) are formed by a vapor deposition method and a lift-off method. Next, the first insulating layer 17 is grown on the entire upper surface of the light-emitting diode array by a chemical vapor deposition (CVD) method, and the common electrodes 4, 4 (Ti/Au/Ti) are then formed by a vapor deposition method and a lift-off method. Further, after the second insulating layer 18 is grown by the CVD method, contact holes 7c, 7a, 7k are formed in both insulating layers 17, 18 or only in the insulating layer 18 by etching on the cathode 2, the anode 3 and desired one of two common electrodes in each block. Ti/Au is sputtered and etched by ion-milling to form Au wiring layers 5 extending to each bonding portion 8.

Though the light-emitting diode array having a 2×2 structure comprising two common electrodes has been explained here, the present invention is also applicable to those having a 4×4 structure comprising four light-emitting portions in one block with four common electrodes, those having a 8×8 structure, a 16×16 structure, etc.

As described above in detail, the light-emitting diode array of the present invention comprises bonding portions separated by the mesa-etched grooves. Accordingly, no short-circuiting would occur in wiring, even though there are Au wiring layers remaining on slanting surfaces of the mesa-etched grooves, or even though the light-emitting diode array is designed such that mesa-etched slanting surfaces are covered with the Au wiring layers, and it is easy to control the dimension of the light-emitting portions, resulting in a high-yield mass production process.

What is claimed is:

1. A light-emitting diode array comprising a conductive layer formed on a substrate, separate light-emitting portions formed on said conductive layer, a first electrode formed on at least part of an upper surface of each light-emitting portion, and a second electrode formed on said conductive layer adjacent to said light-emitting portions; said first electrode comprising a common switching electrode matrix; said second electrode comprising a common electrode divided such that one second electrode exists in every light-emitting portion separate from other light-emitting portions; and at least one bonding pad of bonding pads extending to said first electrode comprising a common switching electrode matrix and said second electrode comprising a common electrode divided being formed on a bonding portion formed on said conductive layer on epitaxial layers separated from each other by a first mesa-etched groove removing part of said epitaxial layers, whereby said bonding pads are separate from each other, wherein said first electrode comprising a common switching electrode matrix and said second electrode comprising a common electrode divided as such for each of said light-emitting portions are formed respectively on the bottom surface of a mesa-etched groove different from the first mesa-etched groove formed by removing said conductive layer, said first electrode comprising a common switching electrode matrix being formed on an insulating layer formed in said mesa-etched groove and said second electrode comprising a common electrode divided as such being formed on a conductive layer.

2. The light-emitting diode array according to claim 1, wherein said second mesa-etched groove has such depth that said substrate is slightly etched, so that no conductive layer remains in areas corresponding to said second mesa-etched groove.

3. The light-emitting diode array according to claim 1, wherein said first mesa-etched groove has a slanting surface free from gold.

4. The light-emitting diode array according to claim 3, further comprising a second mesa-etched groove having such depth that said substrate is slightly etched, so that no conductive layer remains in areas corresponding to said second mesa-etched groove.

* * * * *